United States Patent [19]

Voss

[11] 4,277,307

[45] Jul. 7, 1981

[54] METHOD OF RESTORING SI CRYSTAL LATTICE ORDER AFTER NEUTRON IRRADIATION

[75] Inventor: Peter Voss, Munich, Fed. Rep. of Germany

[73] Assignee: Siemens Aktiengesellschaft, Berlin & Munich, Fed. Rep. of Germany

[21] Appl. No.: 21,912

[22] Filed: Mar. 19, 1979

Related U.S. Application Data

[63] Continuation-in-part of Ser. No. 842,606, Oct. 17, 1977, abandoned.

[51] Int. Cl.³ .............................................. G21G 1/06
[52] U.S. Cl. ................................................... 176/10
[58] Field of Search ............................ 176/10; 148/1.5

[56] References Cited

U.S. PATENT DOCUMENTS

| | | | |
|---|---|---|---|
| 3,076,732 | 2/1963 | Tanenbaum | 176/10 |
| 3,967,982 | 7/1976 | Arndt et al. | 176/10 |
| 4,042,454 | 8/1977 | Haas et al. | 176/10 |

OTHER PUBLICATIONS

IEEE Trans. on Electron Devices vol. ED-23, No. 8, 8/76, pp. 797-802, Janus et al.
J. of Electrochemical Soc. Feb., 1961, pp. 171-176, vol. 108, No. 2, Tanenbaum et al.
J. of Applied Physics vol. 41, No. 6, 5/70, pp. 2607-2635, Cheng et al.

*Primary Examiner*—Harvey E. Behrend
*Attorney, Agent, or Firm*—Hill, Van Santen, Steadman, Chiara & Simpson

[57] ABSTRACT

Si crystal lattice damage caused by neutron irradiation in homogeneously doping Si crystals with $p^{31}$ is removed by an annealing process wherein the minimum temperature is adjusted in accordance with the make-up of the irradiation flux utilized during neutron irradiation and in accordance with the carbon concentration within the irradiated Si crystal.

1 Claim, No Drawings

METHOD OF RESTORING SI CRYSTAL LATTICE ORDER AFTER NEUTRON IRRADIATION

CROSS-REFERENCE TO RELATED APPLICATION

This is a continuation-in-part of my earlier U.S. Ser. No. 842,606 filed Oct. 17, 1977, now abandoned, which is incorporated herein by reference.

BACKGROUND OF THE INVENTION

1. Field of the Invention

The invention relates to homogeneously doped Si crystals and somewhat more particularly to a method of restoring Si crystal lattice order after neutron irradiation.

2. Prior Art

Homogeneously doped Si crystals may be produced via neutron irradiation so that the nuclear reaction:

$$Si^{30}(n,\gamma) Si^{31} \xrightarrow{\beta-} P^{31}$$

occurs within the irradiated Si crystal. The silicon crystal utilized as the stock or starting material for the irradiation generally is produced by thermal decomposition of silicon-containing compounds and generally contains carbon as an impurity. This is known, for example, from N. Schink, "Determination Of Carbon In Trichlorosilane", *Semiconductor Silicon*, (The Electrochemical Society, 1969) pages 85–88. However, such neutron irradiation causes lattice disorder or damage detrimental to the electrical properties of the doped crystal. Such neutron-induced lattice damage may be removed by annealing. For example, German Letters Patent No. 1,214,789 suggests a method of producing homogeneously n-doped Si crystals by irradiating such crystals with thermal neutrons and then heat-treating the so-irradiated crystals at an elevated temperature for a sufficient period of time to remove the lattice damage cause by the neutron irradiation. In accordance with the prior art, the time period of the heat treatment is dependent upon the intensity of the neutron flux in the nuclear reactor during the irradiation process. Accordingly, the respective temperature and time is determined by the degree of crystal lattice damage or distortion produced by the irradiation process. The above-referenced prior art patent suggests that neutron-induced crystal lattice damage may be removed by annealing an irradiated Si crystal for 24 hours in a furnace at 1000° C. Other prior art, for example, German Offenlegungsschrift No. 25 16 514 (owned by the instant assignee and substantially corresponding to Burtscher et al U.S. Ser. No. 676,646, filed Apr. 14, 1976, now abandoned) suggests that such annealing be carried out for a time period at least equal to the time period of a subsequent diffusion process and at a temperature at least as high as that utilized during such subsequent diffusion process.

However, it has been determined that when semiconductor components are produced from such prior art annealed crystals, the electrical properties, particularly the specific electrical resistance, sometimes vary during subsequent diffusion and the like processes.

SUMMARY OF THE INVENTION

The invention provides a method of restoring Si crystal lattice order in a Si monocrystal homogeneously doped via neutron irradiation comprised of an improved annealing process so that the semiconductor components produced from the so-annealed crystals exhibit reproducible electrical properties, which are congruent with at least the specific electrical resistance property of the annealed crystals.

In accordance with the principles of the invention, neutron-irradiated carbon containing Si crystals are subjected to an annealing or heat-treatment process for at least 30 minutes at a minimum temperature adjusted in accordance with the make-up of the irradiation flux utilized during neutron irradiation (i.e., in accordance with the ratio of thermal neutrons to fast neutrons) and in accordance with the carbon concentration within the irradiated crystals. Of course, this carbon concentration is first determined in any known manner before the annealing process.

In embodiments of the invention where the neutron flux utilized to irradiate Si crystals contains at least 99% thermal neutrons (i.e., the neutron flux contains a ratio of thermal neutrons to fast neutrons of 100:1), the annealing temperature is set at a value of at least 700° C., independently of the carbon concentration in the irradiated crystals.

In embodiments where the neutron flux utilized to irradiate Si crystals contains a ratio of thermal neutrons to fast neutrons in the range of 1:1 to less than 10:1, the annealing temperature is set at a value greater than 1100° C. if the irradiated crystals have a carbon concentration greater than $3 \cdot 10^{16}$ atoms/cm$^3$ and the annealing temperature is set in the range of 750° to 1000° C. if the irradiated crystals have a carbon concentration less than $3 \cdot 10^{16}$ atoms/cm$^3$.

In embodiments where the neutron flux utilized to irradiate Si crystals contains a ratio of thermal neutrons to fast neutrons in the range of 10:1 to less than 100:1, the annealing temperature is set at a value greater than 1000° C. if the irradiated crystals have a carbon content greater than $3 \cdot 10^{16}$ atoms/cm$^3$ and the annealing temperature is set to be at least equal to 750° C. if the irradiated crystals have a carbon concentration less than $3 \cdot 10^{16}$ atoms/cm$^3$.

DESCRIPTION OF THE PREFERRED EMBODIMENTS

The invention provides a method of restoring Si crystal lattice order after such crystal has been subjected to neutron irradiation whereby stable and reproducible electrical properties are attained in the so-treated crystals.

In accordance with the principles of the invention, a neutron-irradiated carbon containing Si crystal is annealed over a time period of at least 30 minutes at a minimum temperature adjusted in accordance with the make-up of the irradiation flux (i.e., in accordance with the ratio of thermal to fast neutrons within such flux) and in accordance with the carbon concentration within the irradiated Si crystal.

In an exemplary embodiment of the invention, a carbon containing Si crystal is irradiated with a neutron flux comprised of at least 99% thermal neutrons (i.e., the ratio of thermal to fast neutrons within such a flux is 100:1) and the so-irradiated crystal is then annealed for at least 30 minutes at a temperature at least equal to 700° C., independently of the carbon concentration within the irradiated crystal.

In another embodiment of the invention, a carbon containing Si crystal is irradiated with a neutron flux comprised of less than 99% thermal neutrons (i.e., the ratio of thermal to fast neutrons within such a flux is smaller than 100:1) and the so-irradiated crystal is then annealed for at least 30 minutes at a temperature adjusted in accordance with the actual make-up of the neutron flux and in accordance with the carbon concentration within the irradiated crystal.

In instances in the foregoing embodiment wherein the proportion of thermal to fast neutrons within the irradiation flux is in the range of 1:1 to less than 10:1 and the carbon concentration within the irradiated crystal is greater than $3 \cdot 10^{16}$ atoms/cm$^3$, the annealing temperature is adjusted to be greater than 1100° C. However, with the foregoing neutron flux, when the carbon concentration within an irradiated crystal is less than $3 \cdot 10^{16}$ atoms/cm$^3$, the annealing temperature is adjusted to be in the range of 750° to 1000° C.

In instances in the foregoing embodiment wherein the proportion of thermal to fast neutrons within the irradiation flux is in the range of 10:1 to less than 100:1 and the carbon concentration within the irradiated crystal is greater than $3 \cdot 10^{16}$ atoms/cm$^3$, the annealing temperature is adjusted to be greater than 1000° C. However, with the foregoing neutron flux, when the carbon concentration within an irradiated crystal is less than $3 \cdot 10^{16}$ atoms/cm$^3$, the annealing temperature is adjusted to be at least 750° C.

In other words, the foregoing embodiments of the invention comprise annealing neutron-irradiated carbon containing Si crystals at temperature conditions which are determined by the ratio of thermal to fast neutrons within the neutron flux produced by a nuclear reactor utilized to irradiate the crystals and by the carbon concentration within the so-irradiated crystals so that the annealing temperature is greater than 1000° C. when the carbon concentration within the irradiated crystal is greater than $3 \cdot 10^{16}$ atoms/cm$^3$ and the annealing temperature is at least equal to 750° when the carbon concentration within the irradiated crystal is less than $3 \cdot 10^{16}$ atoms/cm$^3$. In this manner, the annealing effect is independent from the furnace atmosphere existing during an annealing process.

In the development of the invention, it was also determined that the minimum temperature for annealing Si crystal discs having a thickness of less than 2 mm and with the same carbon concentration as in relatively large diameter silicon rods, may be even further lowered relative to the annealing temperature required for such rods.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim:

1. In a method of restoring crystal lattice order in a carbon containing Si monocrystal by annealing this crystal at a minimum temperature, wherein such Si monocrystal is doped by neutron irradiation within a nuclear reactor and is then annealed as a function of irradiation conditions (ratio of thermal to fast neutrons) therein and as a function of the amount of carbon within such irradiated Si monocrystal, the improvement comprising:

determining the amount of carbon within the Si crystal; and adjusting the annealing temperature so that:
  (a) when the ratio of the thermal to fast neutrons within such nuclear reactor is in the range of 1:1 to less than 10:1 and
    (a$_1$) the amount of carbon within said irradiated Si monocrystal is greater than $3 \cdot 10^{16}$ atoms/cm$^3$, the annealing temperature is adjusted to a value greater than 1100° C., and
    (a$_2$) the amount of carbon within said irradiated Si monocrystal is less than $3 \cdot 10^{16}$ atoms/cm$^3$, the annealing temperature is adjusted to a value in the range of 750° to 1000° C.; and
  (b) when the ratio of thermal to fast neutrons within said nuclear reactor is in the range of 10:1 to less than 100:1 and
    (b$_1$) the amount of carbon within said irradiated Si monocrystal is greater than $3 \cdot 10^{16}$ atoms/cm$^3$, the annealing temperature is adjusted to a value greater than 1000° C., and
    (b$_2$) the amount of carbon within said irradiated Si monocrystal is less than $3 \cdot 10^{16}$ atoms/cm$^3$, the annealing temperature is adjusted to a value of at least 750° C.

* * * * *